US012653039B2

(12) United States Patent
Lin et al.

(10) Patent No.: US 12,653,039 B2
(45) Date of Patent: Jun. 9, 2026

(54) SEMICONDUCTOR DEVICE AND METHOD OF FORMING THE SAME

(71) Applicant: Taiwan Semiconductor Manufacturing Company, Ltd., Hsinchu (TW)

(72) Inventors: Yung-Chi Lin, New Taipei City (TW); Ming-Tsu Chung, Hsinchu (TW); Yan-Zuo Tsai, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 509 days.

(21) Appl. No.: 18/186,202

(22) Filed: Mar. 20, 2023

(65) Prior Publication Data

US 2024/0321694 A1     Sep. 26, 2024

(51) Int. Cl.
| | |
|---|---|
| *H01L 21/78* | (2006.01) |
| *H10W 46/00* | (2026.01) |
| *H10W 70/05* | (2026.01) |
| *H10W 70/40* | (2026.01) |
| *H10W 90/00* | (2026.01) |

(52) U.S. Cl.
CPC ......... *H10W 70/417* (2026.01); *H10W 46/00* (2026.01); *H10W 70/05* (2026.01); *H10W 90/00* (2026.01); *H10W 46/301* (2026.01)

(58) Field of Classification Search
CPC ........... H01L 23/49513; H01L 21/4857; H01L 23/544; H01L 25/0657; H01L 2223/54426; H01L 25/50

USPC ......................................................... 257/678
See application file for complete search history.

(56) References Cited

U.S. PATENT DOCUMENTS

| | | | | |
|---|---|---|---|---|
| 6,097,096 A * | 8/2000 | Gardner | ................... | H01L 25/50 |
| | | | | 257/E21.705 |
| 8,648,459 B2 * | 2/2014 | Lee | ........................... | H01L 24/16 |
| | | | | 257/E29.089 |
| 8,993,380 B2 | 3/2015 | Hou et al. | | |
| 9,281,254 B2 | 3/2016 | Yu et al. | | |
| 9,287,251 B2 * | 3/2016 | Kang | ...................... | H01L 24/03 |
| 9,299,649 B2 | 3/2016 | Chiu et al. | | |
| 9,372,206 B2 | 6/2016 | Wu et al. | | |
| 9,425,126 B2 | 8/2016 | Kuo et al. | | |
| 9,443,783 B2 | 9/2016 | Lin et al. | | |
| 9,461,018 B1 | 10/2016 | Tsai et al. | | |
| 9,496,189 B2 | 11/2016 | Yu et al. | | |
| 9,666,502 B2 | 5/2017 | Chen et al. | | |
| 9,735,131 B2 | 8/2017 | Su et al. | | |
| 10,867,943 B2 * | 12/2020 | Chen | ....................... | H01L 24/08 |
| 11,088,116 B2 * | 8/2021 | Wu | .......................... | H01L 25/50 |
| 11,094,653 B2 * | 8/2021 | Wu | .......................... | H01L 24/08 |
| 11,631,647 B2 * | 4/2023 | Haba | ....................... | H01L 21/78 |
| | | | | 257/777 |
| 12,014,975 B2 * | 6/2024 | Jang | ........................ | H01L 24/04 |
| 12,080,672 B2 * | 9/2024 | Haba | .................... | H01L 23/3185 |
| 12,100,676 B2 * | 9/2024 | Uzoh | ....................... | H01L 24/08 |

(Continued)

*Primary Examiner* — Vu A Vu
(74) *Attorney, Agent, or Firm* — JCIPRNET

(57) ABSTRACT

A semiconductor device includes a first die. The first die includes a first dielectric bonding layer thereon and a plurality of first dielectric bonding patterns in the first dielectric bonding layer. A composition of the first dielectric bonding patterns is different from a composition of the first dielectric bonding layer.

20 Claims, 14 Drawing Sheets

(56) References Cited

U.S. PATENT DOCUMENTS

| 2024/0186269 A1* | 6/2024 | Haba | H01L 23/552 |
| 2025/0006679 A1* | 1/2025 | Theil | H01L 24/08 |

* cited by examiner

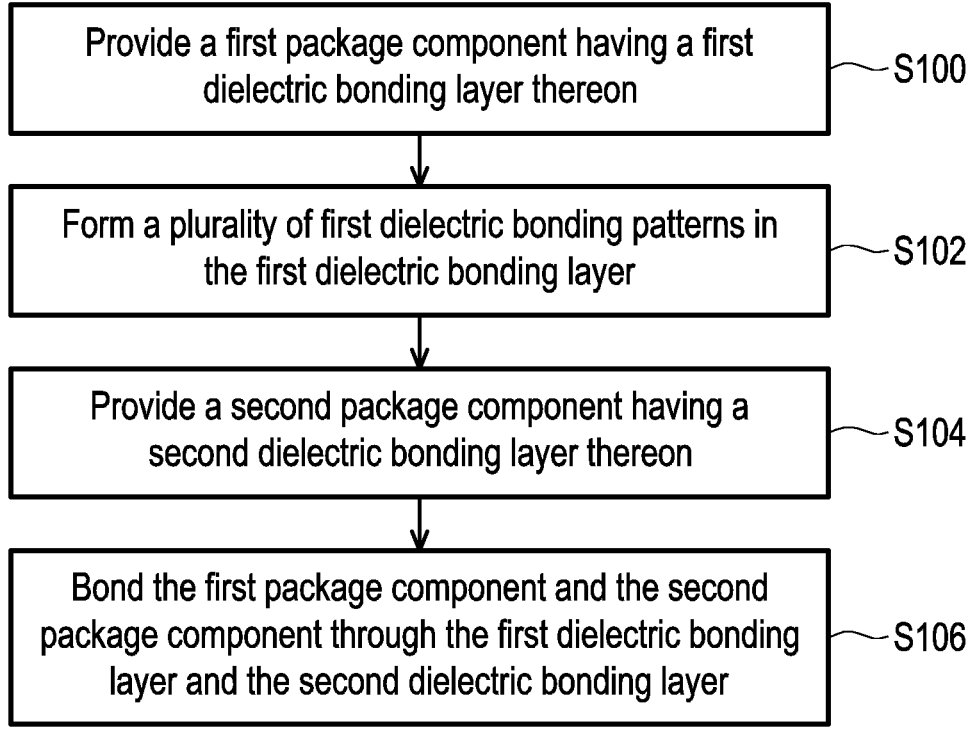

Provide a first package component having a first dielectric bonding layer thereon ⏤ S100

Form a plurality of first dielectric bonding patterns in the first dielectric bonding layer ⏤ S102

Provide a second package component having a second dielectric bonding layer thereon ⏤ S104

Bond the first package component and the second package component through the first dielectric bonding layer and the second dielectric bonding layer ⏤ S106

FIG. 11

SEMICONDUCTOR DEVICE AND METHOD OF FORMING THE SAME

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuit (3DIC) packages, wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 illustrates a method of forming a semiconductor device according to some embodiments.

DETAILED DESCRIPTION

Figure 1A:
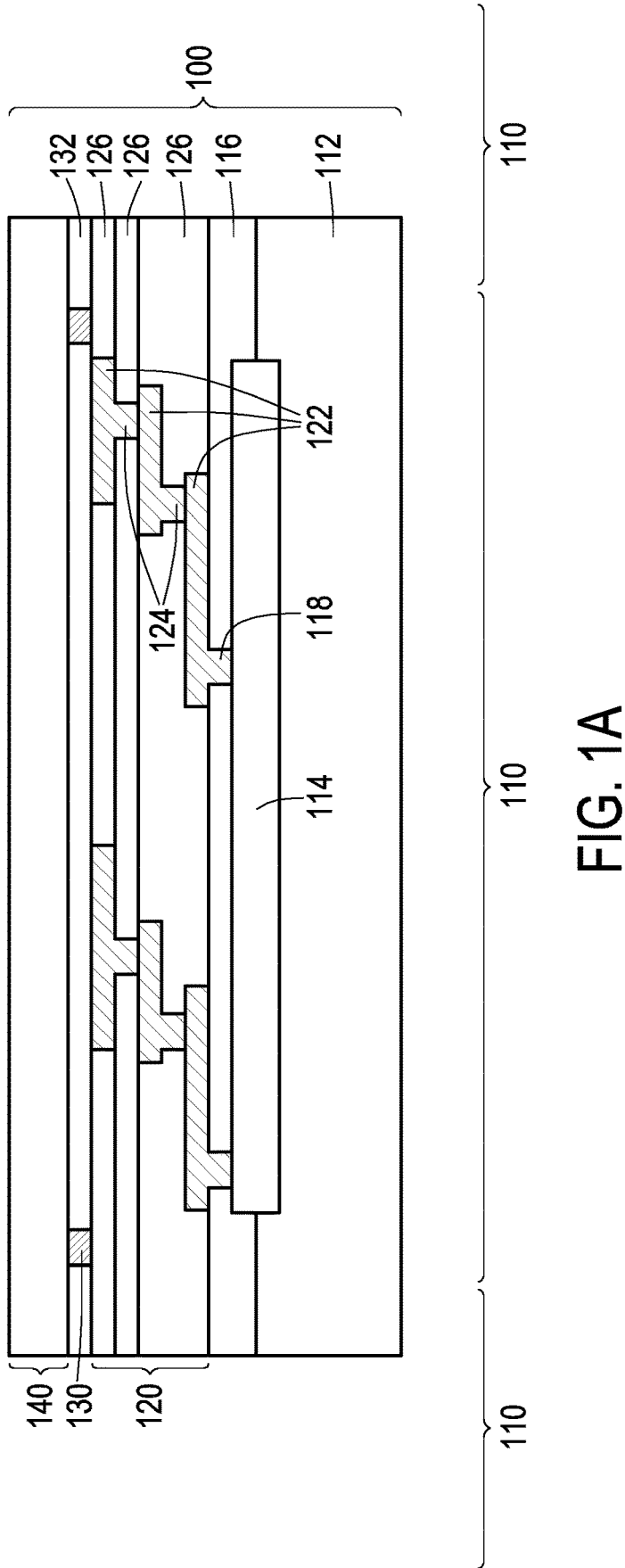
FIG. 1A to FIG. 1D are schematic cross-sectional views of various stages in a method of forming a semiconductor device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

FIG. 1A to FIG. 1D are schematic cross-sectional views of various stages in a method of forming a semiconductor device according to some embodiments.

Referring to FIG. 1A, a package component 100 is provided. In some embodiments, the package component 100 is or includes a device wafer including active devices or possibly passive devices. The package component 100 may include a plurality of chips 110 therein, with one of chips 110 being illustrated. In alternative embodiments, the package component 100 is or includes an interposer wafer, which is free of active devices, and may or may not include passive devices. In alternative embodiments, the package component 100 is or includes a package substrate strip, which includes a core-less package substrate or a cored package substrate with a core therein. In alternative embodiments, the package component 100 includes a package such as an Integrated Fan-Out (InFO) Package. The package component 100, instead of being at wafer level, may also be at die level, and may be a device die, an interposer die, a package substrate, a discrete package (that has been sawed from a reconstructed wafer), or the like. In following discussion, a device wafer is used as an example of the package component 100, and the package component 100 may also be referred to as a wafer. The embodiments may also be applied on interposer wafers, package substrates, reconstructed wafers, discrete packages, discrete device dies, discrete interposer dies, etc.

In some embodiments, the package component 100 includes a semiconductor substrate 112, a device 114 and an interconnect structure 120. In some embodiments, the semiconductor substrate 112 is a bulk semiconductor substrate. A "bulk" semiconductor substrate refers to a substrate that is entirely composed of at least one semiconductor material. In some embodiments, the bulk semiconductor substrate includes a semiconductor material or a stack of semiconductor materials such as silicon (Si), germanium (Ge), silicon germanium (SiGe), carbon doped silicon (Si:C), silicon germanium carbon (SiGeC); or an III-V compound semiconductor such as gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the bulk semiconductor substrate includes a single crystalline semiconductor material such as single crystalline silicon. In some embodiments, the bulk semiconductor substrate is doped depending on design requirements. In some embodiments, the bulk semiconductor substrate is doped with p-type dopants or n-type dopants. The term "p-type" refers to the addition of impurities to an intrinsic semiconductor that creates deficiencies of valence electrons. Exemplary p-type dopants, i.e., p-type impurities, include, but are not limited to, boron, aluminum, gallium, and indium. "N-type" refers to the addition of impurities that contribute free electrons to an intrinsic semiconductor. Exemplary n-type dopants, i.e., n-type impurities, include, but are not limited to, antimony, arsenic, and phosphorous. If doped, the semiconductor substrate 112, in some embodiments, has a dopant concentration in a range from $1.0 \times 10^{14}$ atoms/cm$^3$ to $1.0 \times 10^{17}$ atoms/cm$^3$, although the dopant concentrations may be greater or smaller. In some embodiments, the semiconductor substrate 112 is a semiconductor-on-insulator (SOI) substrate including a top semiconductor layer formed on an insulator layer (not shown). The top semiconductor layer includes the above-mentioned semiconductor material such as Si, Ge, SiGe, Si:C, SiGeC; or an III-V compound semiconductor including GaAs, GaP, InP, InAs, InSb, GaAsP, AlInAs, AlGaAs, GaInAs, GaInP, or GaInASP. The insulator layer is, for example, a silicon oxide layer, or the like. The insulator layer is provided over a base substrate, typically a silicon or glass substrate.

The device 114 is disposed in and/or over the semiconductor substrate 112. The device 114 may be an active device or possibly a passive device. In some embodiments, a plurality of isolation structures (not shown) are formed in the semiconductor substrate 112 to define an active area where the device 114 is formed. In some embodiments, when the device 114 is an active device, the device 114 includes a transistor having a gate structure (not shown), a source region (not shown) and a drain region (not shown) at opposite sides of the gate structures. The gate structure may include a gate dielectric layer, a gate electrode on the gate dielectric layer and spacers on opposite sidewalls of the gate dielectric layer and the gate electrode. In some embodiments, the gate dielectric layer includes an oxide, a metal oxide, the like, or combinations thereof. The gate electrode may include a metal-containing material such as titanium nitride, titanium oxide, tantalum nitride, tantalum carbide, cobalt, ruthenium, aluminum, tungsten, combinations thereof, or multi-layers thereof. The source region and the drain region may be epitaxial source and drain regions epitaxially grown in a recess (not shown) of the semiconductor substrate 112 using a process such as chemical vapor deposition (CVD), atomic layer deposition (ALD), vapor phase epitaxy (VPE), molecular beam epitaxy (MBE), or the like. Top surfaces of the source region and the drain region may be protruded from or substantially flush with a surface of the semiconductor substrate 112, and bottom surfaces of the source region and the drain region may be substantially flush with each other.

An inter-layer dielectric (ILD) 116 is formed over the semiconductor substrate 112 and fills the spaces between the gate structures of the transistors in the devices 114. In some embodiments, the ILD 116 is formed of Phospho Silicate Glass (PSG), Boro Silicate Glass (BSG), Boron-doped Phospho Silicate Glass (BPSG), Fluorine-doped Silicate Glass (FSG), silicon oxide, silicon oxynitride, silicon nitride, a low-k dielectric material, or the like. The ILD 116 may be formed using spin coating, flowable chemical vapor deposition (FCVD), or the like. In some embodiments, and the ILD 116 is formed using a deposition method such as plasma enhanced chemical vapor deposition (PECVD), low pressure chemical vapor deposition (LPCVD), or the like.

Contact plugs 118 are formed in the ILD 116, and are used to electrically connect the device 114 to overlying conductive features such as the gate structure, the source region, the drain region, metals and vias. In some embodiments, the contact plugs 118 are formed of or include a conductive material selected from tungsten, aluminum, copper, titanium, tantalum, titanium nitride, tantalum nitride, alloys therefore, and/or multi-layers thereof. The formation of the contact plugs 118 may include forming contact openings in the ILD 116, filling a conductive material(s) into the contact openings, and performing a planarization process (such as a chemical mechanical polish (CMP) process or a mechanical grinding process) to level the top surfaces of the contact plugs 118 with the top surface of the ILD 116.

The interconnect structure 120 is formed over the ILD 116 and the contact plugs 118. The interconnect structure 120 may include metal lines 122 and vias 124, which are formed in dielectric layers 126 (also referred to as Inter-metal Dielectrics (IMDs)). The metal lines at a same level are collectively referred to as a metal layer hereinafter. In some embodiments, the interconnect structure 120 includes a plurality of metal layers, each including the metal lines 122 that are interconnected through the vias 124. The metal lines 122 and the vias 124 may be formed of copper or copper alloys, and they can also be formed of other metals. In some embodiments, the dielectric layers 126 are formed of low-k dielectric materials. The dielectric constants (k values) of the low-k dielectric materials may be lower than about 3.0, for example. The dielectric layers 126 may include a carbon-containing low-k dielectric material, hydrogen silsesquioxane (HSQ), methylsilsesquioxane (MSQ), or the like.

The formation of the metal lines 122 and the vias 124 in the dielectric layers 126 may include single damascene processes and/or dual damascene processes. In a single damascene process for forming a metal line or a via, a trench or a via opening is first formed in one of the dielectric layers 126, followed by filling the trench or the via opening with a conductive material. A planarization process such as a CMP process is then performed to remove the excess portions of the conductive material higher than the top surface of the dielectric layer, leaving a metal line or a via in the corresponding trench or via opening. In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

The interconnect structure 120 may further include a passivation layer, which may be formed of a non-low-k dielectric material over the low-k dielectric layer. The passivation layer may be formed of or include undoped silicate glass, silicon nitride, silicon oxide, or the like. There may also be metal pads (such as aluminum copper pads), post passivation interconnect (PPI), or the like, which are represented by conductive features.

In some embodiments, as shown in FIG. 1A, alignment marks 130 are formed in a dielectric layer 132 over the interconnect structure 120. The alignment marks 130 may provide features for alignment during bonding, photolithographic processing, device testing, inspection, measurement, or the like. For example, the alignment marks 130 indicate the alignment of the package component 100 during a bonding process, such as below the bonding process with reference to FIG. 1C and FIG. 1D described. The alignment marks 130 may be formed on or near a front side or a back side of the package component 100. In some embodiments, the alignment marks 130 are dummy structures that are electrically isolated from the interconnect structure 120 or conductive pads (if present). In alternative embodiments, the alignment marks 130 are electrically coupled to the interconnect structure 120 or conductive pads (if present). In some embodiments, the alignment marks 130 are grounded. The alignment marks 130 may be, for example, a photo alignment mark, an SEM (Scanning Electron Microscope) mark, a laser mark, or some other type of alignment mark.

The alignment marks 130 may be formed in one or more chips of the same wafer such as chips 110 of the package component 100. In some embodiments, the alignment marks 130 are formed in the dielectric layer 132 over the interconnect structure 120. However, the alignment marks 130 may be formed in any suitable layer of the package component 100, such as in one of the dielectric layers 126 of the interconnect structure 120, in the ILD 116 or the like.

The alignment marks 130 may be formed by any suitable technique, such as a laser drilling process, a photolithography and etching process, or the like. For example, a photolithography and etching process can be used to pattern openings in a layer corresponding to the alignment marks 130, and then one or more materials (e.g., dielectric, conductive, etc.) can be deposited in the openings to define the alignment marks 130. In alternative embodiments, the alignment marks 130 are openings or cavities that are not filled with any material. In some embodiments, the alignment marks 130 are formed by one or more of the same processing steps used to form the features of the package component 100. For example, the alignment marks 130 are formed of conductive material by the same processing steps used to form the conductive pads (not shown) or a metallization structure of the interconnect structure 120. The alignment marks 130 can also be formed by processing steps other than those in these examples. Other techniques for forming the alignment marks 130 are possible and within the scope of the invention.

A dielectric bonding layer 140 is formed over the package component 100. In some embodiments, the dielectric bonding layer 140 is formed on the dielectric layer 132 over the interconnect structure 120. The dielectric bonding layer 140 may be formed using spin coating, flowable chemical vapor deposition (FCVD), or the like. In some embodiments, the dielectric bonding layer 140 is formed using a deposition method such as plasma enhanced chemical vapor deposition (PECVD), low pressure chemical vapor deposition (LPCVD), or the like. The dielectric bonding layer 140 may have a substantially coplanar surface.

In some embodiments, the dielectric bonding layer 140 is a blanket dielectric layer that is free from conductive features (such as conductive lines and conductive pads) therein. In some embodiments, the dielectric bonding layer 140 is a homogeneous layer having a uniform composition from the top surface to the bottom surface of the dielectric bonding layer 140. Throughout the description, when two parts (such as two layers) are referred to as having the same composition, it means that the two parts have same types of elements, and the percentages of the corresponding elements in two parts are the same as each other. Conversely, when two parts are referred to as having different compositions, it means that one of the two parts either has at least one element not in the other part, or the two parts have the same elements, but the percentages of the elements in two parts are different from each other.

In some embodiments, the dielectric bonding layer 140 is formed of a silicon-base dielectric material that includes one of oxide, carbon and nitrogen. The corresponding dielectric bonding layer 140 is also referred to as oxide-, carbon- or nitrogen-containing dielectric layer. The dielectric bonding layer 140 may be expressed as $SiO_xN_yC_z$, with x being in the range between about 0 and about 2 (x=0~2), y being in the range between about 0 and about 1.33 (y=0~1.33), and z being in the range between about 0 and about 1 (z=0~1), and x, y, and z will not be all equal to zero. For example, the dielectric bonding layer 140 is formed of or includes $SiO_2$, SiON, SiOC, SiN, SiCN, SiC, SiON, the like or a combination thereof. The dielectric bonding layer 140 may also be undoped or doped with group III elements such as B, Ga, In, or the like, or group IV elements such as P, As, Sb, or the like. In some embodiments, a thickness of the dielectric bonding layer 140 is in a range of 0.5 um to 1.5 um.

Figure 1B:
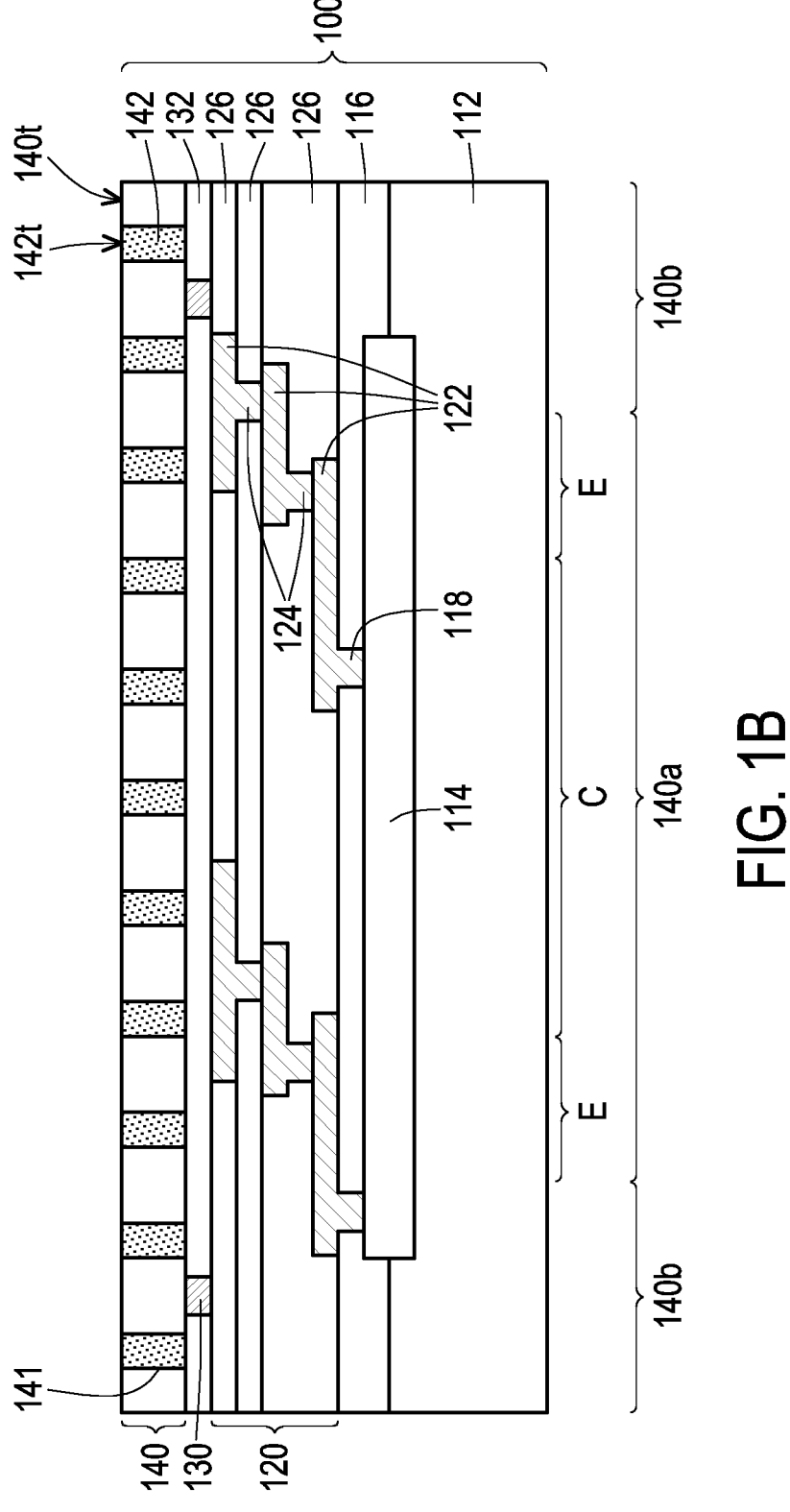
Figure 2:
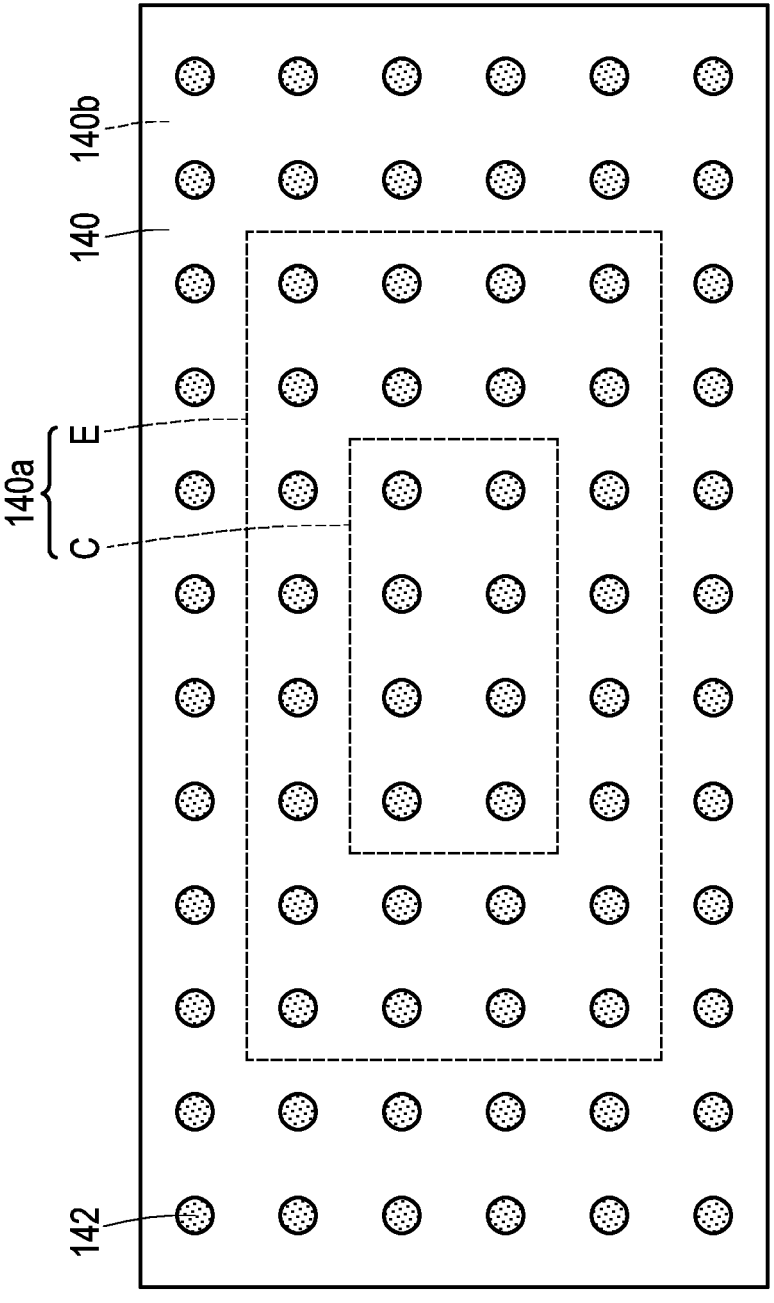
FIG. 2 is a schematic top view of a semiconductor device according to some embodiments.

Referring to FIG. 1B and FIG. 2, a plurality of dielectric bonding patterns 142 are formed in the dielectric bonding layer 140. In some embodiments, a plurality of openings 141 are formed, and then the dielectric bonding patterns 142 are respectively formed in the openings 141. The dielectric bonding patterns 142 fill up the openings 141 respectively, for example. The dielectric bonding patterns 142 may be formed by a deposition process such as high density plasma chemical vapor deposition (HDP-CVD) or the like. In some embodiments, a CMP process or a mechanical grinding process is further performed on surfaces of the dielectric bonding patterns 142 until the top surfaces 142t of the resulting dielectric bonding patterns 142 is substantially coplanar with the top surface 140t of the dielectric bonding layer 140. In alternative embodiments, the dielectric bonding patterns 142 are formed by using tetra-ethyl-orthosilicate (TEOS) process. The dielectric bonding patterns 142 may be separately formed or simultaneously formed.

In some embodiments, the dielectric bonding patterns 142 are physically separated from each other by the dielectric bonding layer 140. The dielectric bonding patterns 142 may be arranged regularly or randomly in the dielectric bonding layer 140, so that the dielectric bonding layer 140 has the dielectric bonding patterns 142 therein. In some embodiments, the dielectric bonding layer 140 includes a bonding region 140a to be bonded to another package component and a non-bonding region 140b outside the bonding region 140a. For example, as shown in FIG. 2, the bonding region 140a is surrounded by the non-bonding region 140b. In some embodiments, the dielectric bonding patterns 142 are disposed in both the bonding region 140a and non-bonding region 140b. In some embodiments, the dielectric bonding patterns 142 are arranged regularly in an array in the dielectric bonding layer 140, to improve the uniformity of CMP process. For example, the density of the dielectric bonding patterns 142 in the bonding region 140a is substantially the same as the density of the dielectric bonding patterns 142 in the non-bonding region 140b. The density may be the number of the dielectric bonding patterns 142 in a given area, or a ratio of the projected area of the dielectric bonding patterns 142 in the bonding region 140a onto the semiconductor substrate 112 to the projected area of the bonding region 140a onto the semiconductor substrate 112. Furthermore, the density of the dielectric bonding patterns 142 in the center region C of the bonding region 140a may be substantially the same as the density of the dielectric bonding patterns 142 in the edge region E of the bonding region 140a. For example, the spacing between the dielectric bonding patterns 142 in the bonding region 140a is substantially the same as the spacing between the dielectric bonding patterns 142 in the non-bonding region 140b. The center region C is the region of the package component 100 to be firstly contact with anther package component to be bonded, and the edge region E is aside the center region C. For example, as shown in FIG. 2, the center region C is surrounded by the edge region E. In alternative embodiments, the density of the dielectric bonding patterns 142 in the bonding region 140a is different from (e.g., not larger than) the density of the dielectric bonding patterns 142 in the non-bonding region 140b. In alternative embodiments, the density of the dielectric bonding patterns 142 in the center region C of the bonding region 140a is different from (e.g., not larger than) the density of the dielectric bonding patterns 142 in the edge region E of the bonding region 140a.

As shown in FIG. 2, the dielectric bonding layer 140 is shaped as a net, and the dielectric bonding patterns 142 are shaped as islands, for example. From a top view, a ratio of a total area of the dielectric bonding patterns 142 to a total area of the dielectric bonding layer 140 may be in a range of 5% to 25%. The dielectric bonding patterns 142 may be each shaped in circle, rectangular, bar or any suitable shape in a top view. The dielectric bonding patterns 142 may each have a dimension (e.g., diameter or width) in a range of 1.5 um to 4.5 um. The dimension of the dielectric bonding patterns 142 may be the same or different. The dielectric bonding patterns 142 have substantially the same heights or different heights. In some embodiments, the dielectric bonding pattern 142 penetrates through the dielectric bonding layer 140, and thus the dielectric bonding pattern 142 has a height substantially the same as the thickness of the dielectric bonding layer 140. In alternative embodiments, the dielectric bonding pattern 142 is embedded in the dielectric bonding layer 140 without penetrating through the dielectric bonding layer 140. In such embodiments, a first surface of the dielectric bonding pattern 142 facing to the package component 200 is substantially coplanar with a first surface of the dielectric bonding layer 140 facing to the package component 200. A second surface opposite to the first surface of the dielectric bonding pattern 142 is higher than a second surface opposite to the first surface of the dielectric bonding layer 140. In other words, the height of the dielectric bonding pattern 142 is smaller than the thickness of the dielectric bonding layer 140.

In some embodiments, the dielectric bonding pattern 142 is a homogeneous pattern having a uniform composition from the top surface to the bottom surface of the dielectric bonding pattern 142. In some embodiments, the dielectric bonding patterns 142 have the same composition or different compositions. In some embodiments, the dielectric bonding pattern 142 is formed of a silicon-base dielectric material that includes one of oxide, carbon and nitrogen. The corresponding dielectric bonding pattern 142 is also referred to as oxide-, carbon- or nitrogen-containing dielectric pattern. The bonding pattern 142 may be expressed as $SiO_xN_yC_z$, with x being in the range between about 0 and about 2 (x=0~2), y being in the range between about 0 and about 1.33 (y=0~1.33), and z being in the range between about 0 and about 1 (z=0~1), and x, y, and z will not be all equal to zero. For example, the dielectric bonding pattern 142 is formed of or includes $SiO_2$, SiON, SiOC, SiN, SICN, SiC. SiON, the like or a combination thereof. The dielectric bonding pattern 142 may also be undoped or doped with group III elements such as B, Ga, In, or the like, or group IV elements such as P, As, Sb, or the like.

The composition of the dielectric bonding patterns 142 is different from the composition of the dielectric bonding layer 140. For example, an interface exists between the dielectric bonding layer 140 and the dielectric bonding patterns 142. In some embodiments, the dielectric bonding layer 140 and the dielectric bonding patterns 142 have different materials, which means that at least one or both of the dielectric bonding layer 140 and the dielectric bonding pattern 142 includes an element (such as O, C, or N) that is not in the other one of the dielectric bonding layer 140 and the dielectric bonding pattern 142. In alternative embodiments, the dielectric bonding layer 140 and the dielectric bonding pattern 142 have the same elements, but have different atomic percentages of the elements. For example, both of the dielectric bonding layer 140 and the dielectric bonding pattern 142 have SiON, the dielectric bonding layer 140 has a first oxygen atomic percentage different from a second oxygen atomic percentage in the dielectric bonding pattern 142, and/or the dielectric bonding layer 140 has a first nitrogen atomic percentage different from a second nitrogen atomic percentage in the dielectric bonding pattern 142. In such embodiments, the dielectric bonding patterns 142 may be formed by partially doping the dielectric bonding layer 140, such that the dielectric bonding layer 140 has a plurality of doped regions corresponding to the dielectric bonding patterns 142. The dielectric bonding patterns 142 may have the same or different doping depth, and each dielectric bonding pattern 142 may have a gradient doping concentration from top to bottom.

Figure 1C:
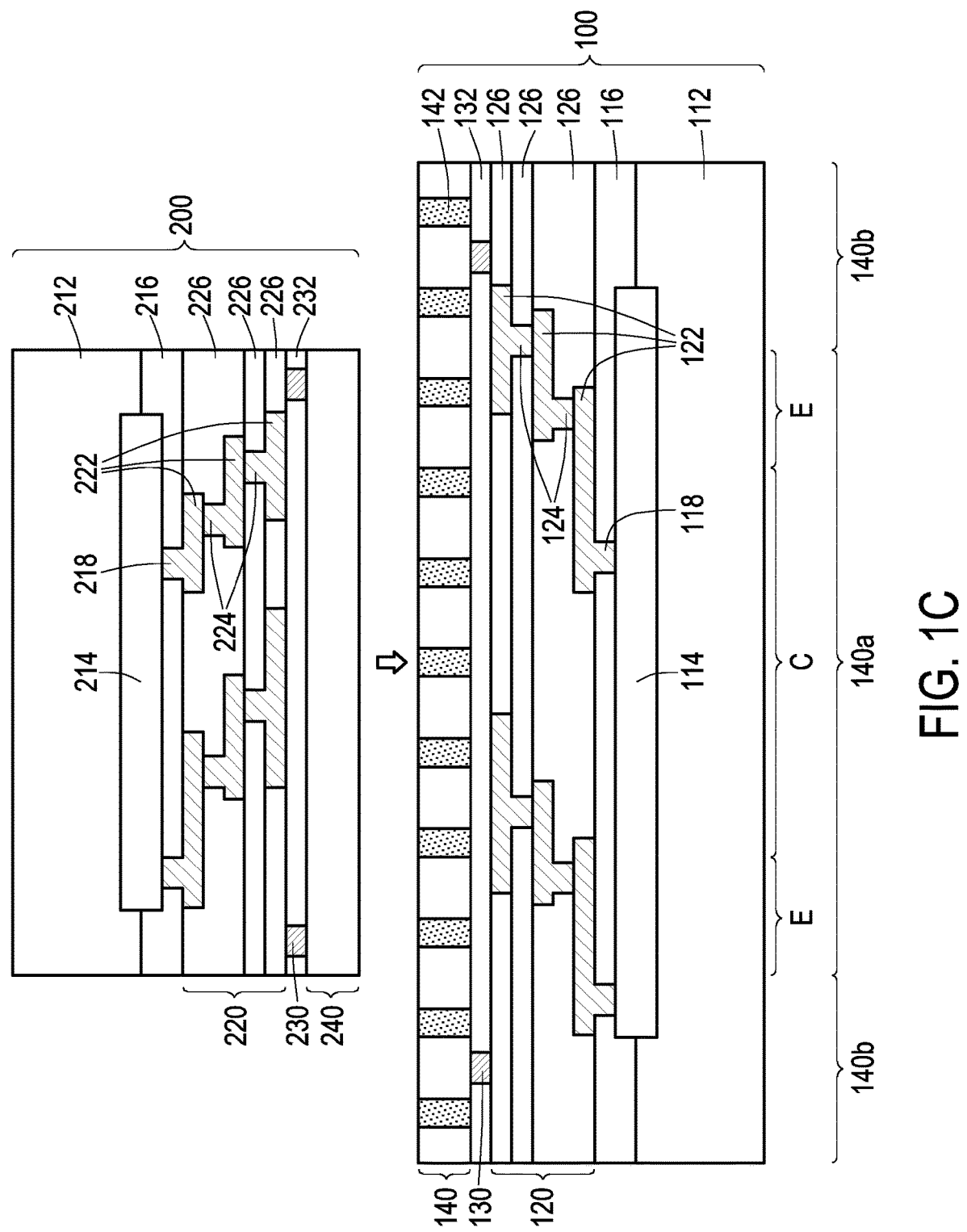

Referring to FIG. 1C, a package component 200 is formed, and is aligned to the package component 100. In some embodiments, the package component 200 has already been formed. In some embodiments, the package component 200 is a die-level package component such as a device die, an interposer, a package substrate, a discrete package (that has been sawed from a reconstructed wafer), or the like. In alternative embodiments, instead of being a die-level package component, the package component 200 is a device wafer, an interposer wafer, a package substrate strip, a package, or the like. In such embodiments, the package component 200 is a same type of package component as the package component 100, or may be a different type of package the package component 100. For example, when the package component 100 is a device wafer, the package component 200 is an interposer wafer or a package. In subsequent discussion, a device die is used as an example of the package component 200, and the package component 200 may also be referred to as a die. The embodiments of the present disclosure may also be applied on interposer wafers, package substrates, packages, etc.

The materials of the features in the package component 200 may be found referring to the like features in the package component 100, with the like features in the package component 200 being denoted by adding number "1" in front of the reference numbers of the corresponding features in the package component 100. For example, the package component 200 includes a semiconductor substrate 212, a device 214 and an interconnect structure 220. The package component 200 may further include an ILD 216, contact plugs 218, metal lines 222, vias 224, dielectric layers 226, alignment marks 230 and a dielectric layer 232. The details of these features may be similar to the corresponding features in the package component 100, and are not repeated herein. In some embodiments, the alignment marks 230 and the dielectric layer 232 are omitted.

In some embodiments, the package component 200 further includes a dielectric bonding layer 240 at a surface. The dielectric bonding layer 240 may be a blanket dielectric layer that is free of conductive features (such as conductive lines and conductive pads) therein, or may be a patterned dielectric layer having a plurality of dielectric bonding patterns therein. In some embodiments, the dielectric bonding layer 240 is a blanket dielectric layer and is a homogeneous layer having a uniform composition from the top surface to the bottom surface of dielectric bonding layer 240. The dielectric bonding layer 240 is formed of a silicon-base dielectric material that includes one of oxide, carbon and nitrogen. The corresponding dielectric bonding layer 240 is also referred to as oxide-, carbon- or nitrogen-containing dielectric layer. The dielectric bonding layer 240 may be expressed as $SiO_xN_yC_z$, with x being in the range between about 0 and about 2 (x=0~2), y being in the range between about 0 and about 1.33 (y=0~1.33), and z being in the range between about 0 and about 1 (z=0~1), and x, y, and z will not be all equal to zero. For example, the dielectric bonding layer 140 is formed of or includes $SiO_2$, SiON, SiOC, SiN, SiCN, SiC, SiON, the like or a combination thereof. The dielectric bonding layer 240 may also be undoped or doped with group III elements such as B, Ga, In, or the like, or group IV elements such as P, As, Sb, or the like. The composition of the dielectric bonding layer 240 may be the same as or different from the composition of the dielectric bonding layer 140 and/or the dielectric bonding pattern 142.

Figure 1D:
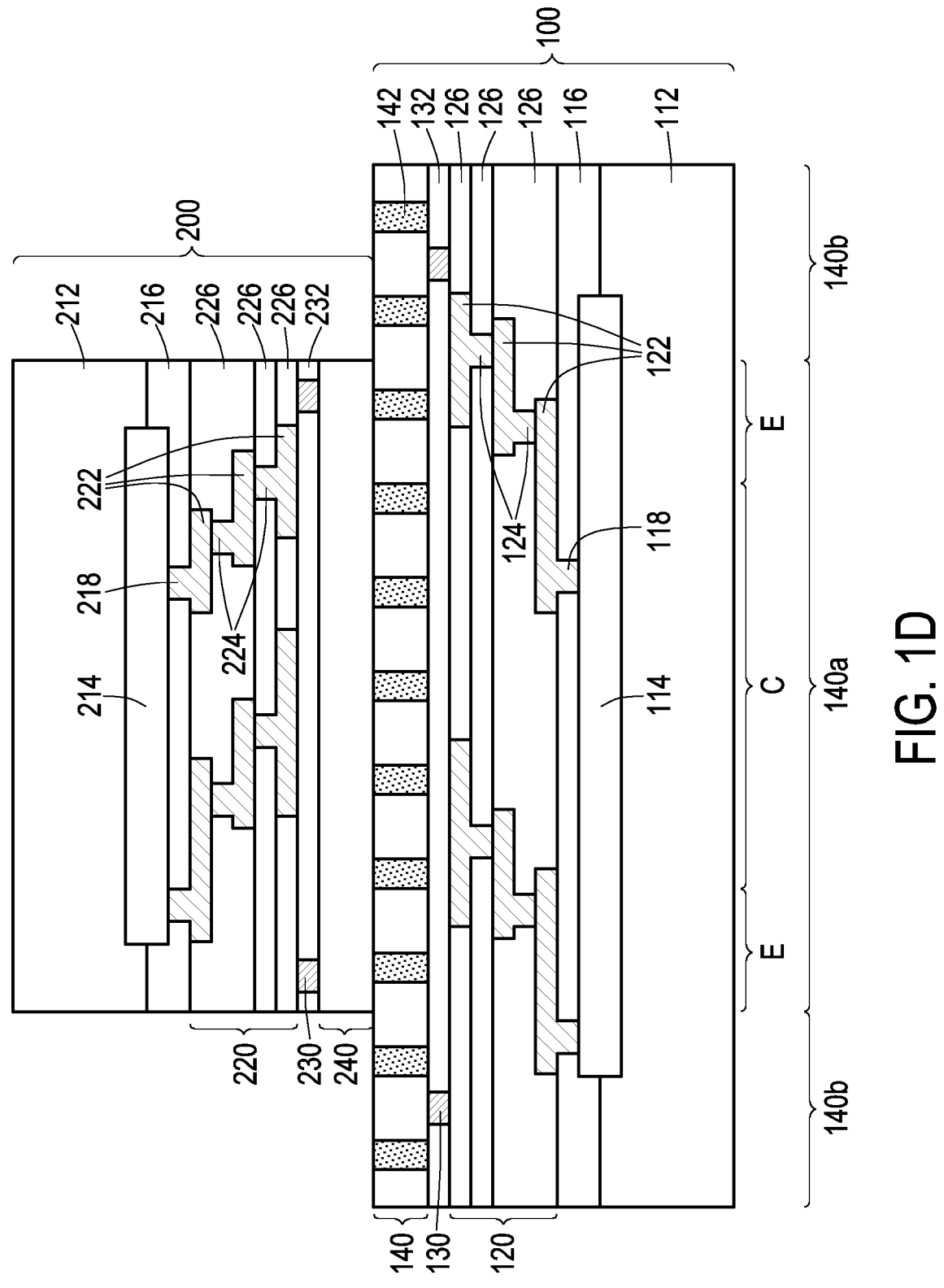

Referring to FIG. 1D, a bonding process is performed. The bonding process is, for example, a fusion bonding or a dielectric-to-dielectric bonding. In some embodiments, a pre-bonding process and an annealing process are sequentially performed. In some embodiments, during the pre-bonding, the package component 200 is put into contact with the bonding region 140a of the package component 100, with a pressing force applied to press the package components 100 and 200 against each other. The pressing force may be lower than about 5 Newton per die, while a greater or smaller force may also be used. The pre-bonding may be performed at room temperature (between about 20° C. and about 25° C.), and a higher temperature may also be used.

Since the dielectric bonding layers 140 and 240 may be exposed to air before pre-bonding, the surface layer of each of the dielectric bonding layers 140 and 240 may be oxidized and have native oxide, which may have a thickness smaller than about 20 Å, and may be smaller than about 10 Å. The native oxide layers have increased oxygen atomic percentage than the underlying un-oxidized portions.

The pre-bonding starts from putting the center of the package component 200 to the center of the bonding region 140a of the package component 100. The contacting propagates from the centers to the edges of the package components 100 and 200, which is also referred to as a bonding wave propagation path from the centers to the edges. In some embodiments, the dielectric bonding layer 140 is in direct contact with the dielectric bonding layer 240, and the dielectric bonding patterns 142 are in direct contact with the dielectric bonding layer 240.

After the pre-bonding, an annealing process is performed, for example, with Si—O—Si bonds being formed between the dielectric bonding layers 140 and 240, so that the dielectric bonding layers 140 and 240 are bonded to each other with high bonding strength. After bonding, a semiconductor device such as a composite wafer is thus formed, as shown in FIG. 1D. In some embodiments, the annealing process is performed at a temperature lower than 250° C., and may be lower than about 200° C. For example, the annealing may be performed at a temperature in the range between about 150° C. and about 200° C. The annealing duration may be in the range between about 5 minutes and about 30 minutes in some embodiments.

It is known that the fusion bonding process of the stacking process may suffer Joule-Thomson effect (J-T effect), and will result in yield loss (especially after thermal process). In some embodiments, since the dielectric bonding layer 140 has the dielectric bonding patterns 142 therein, the bonding wave propagates along different compositions of the dielectric bonding layer 140 and the dielectric bonding patterns 142. In other words, the bonding wave propagation path may be discontinuous, and J-T effect may be minimized. Accordingly, the non-bonding defect is reduced and the formed bonding structure is robust, and the yield is improved.

Figure 3:
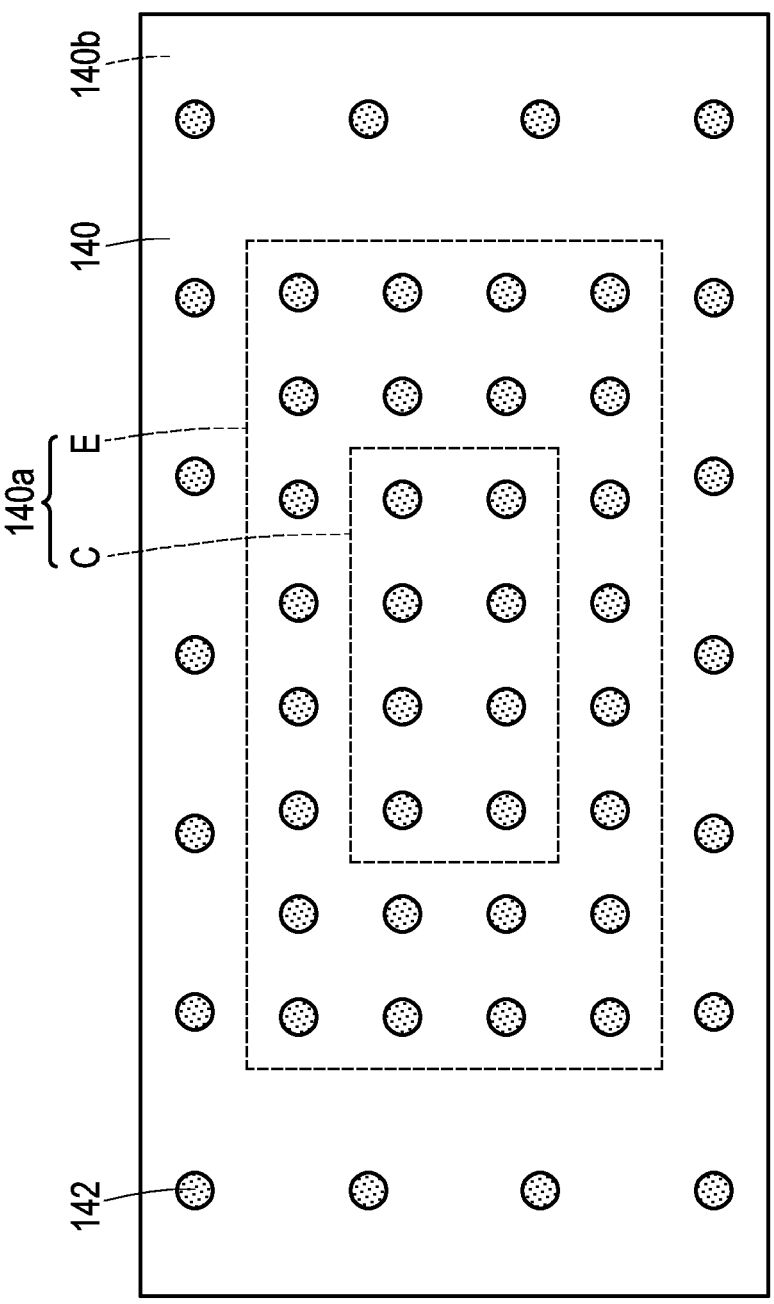
FIG. 3 is a schematic top view of a semiconductor device according to some embodiments.
Figure 4:
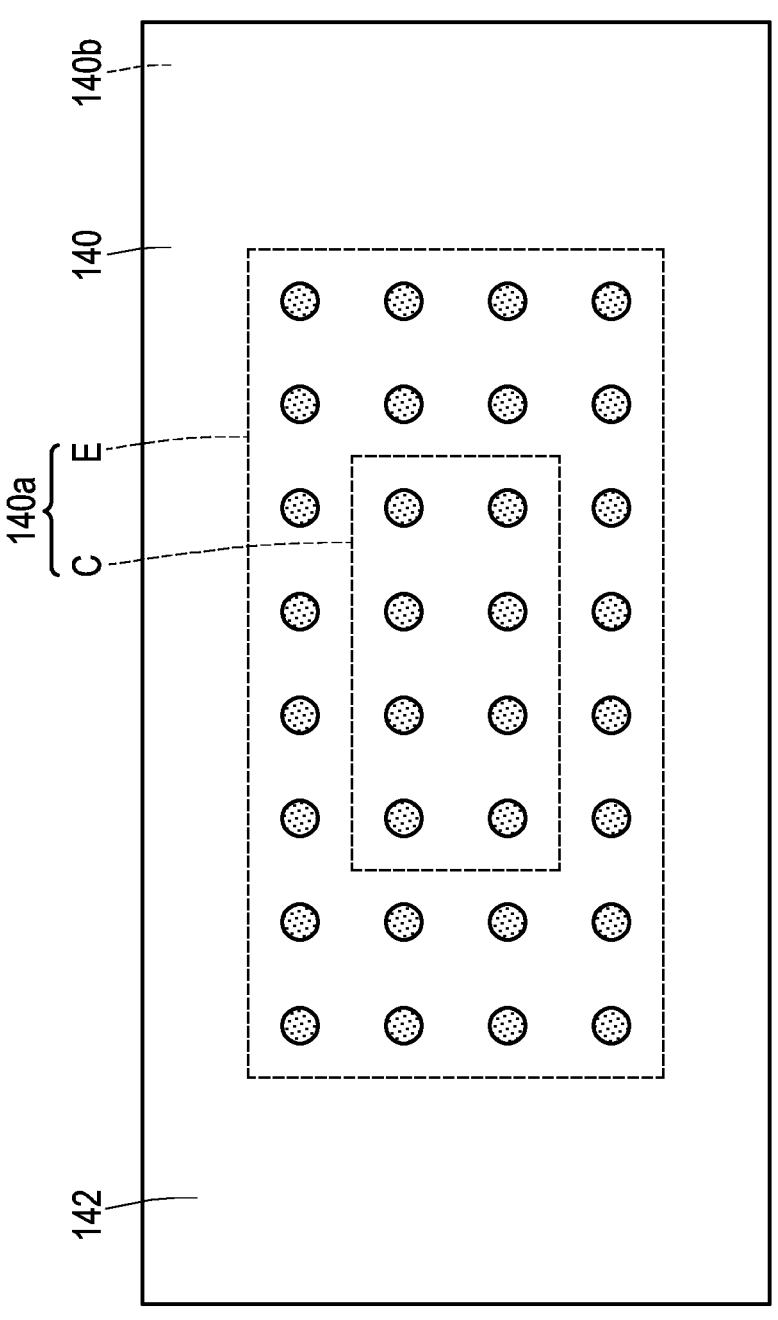
FIG. 4 is a schematic top view of a semiconductor device according to some embodiments.

In some embodiments, the density of the dielectric bonding patterns 142 in the bonding region 140a is substantially the same as the density of the dielectric bonding patterns 142 in the non-bonding region 140b. However, the disclosure is not limited thereto. In alternative embodiments, as shown in FIG. 3, the density of the dielectric bonding patterns 142 in the bonding region 140a is larger than the density of the dielectric bonding patterns 142 in the non-bonding region 140b. For example, the spacing between the dielectric bonding patterns 142 in the bonding region 140a is smaller than the spacing between the dielectric bonding patterns 142 in the non-bonding region 140b. In alternative embodiments, as shown in FIG. 4, the dielectric bonding patterns 142 are only formed in the bonding region 140a of the bonding layer 140. In such embodiments, a ratio of a total area of the dielectric bonding patterns 142 to a total area of the dielectric bonding layer 140 may be in a range of 15% to 45%.

Figure 5:
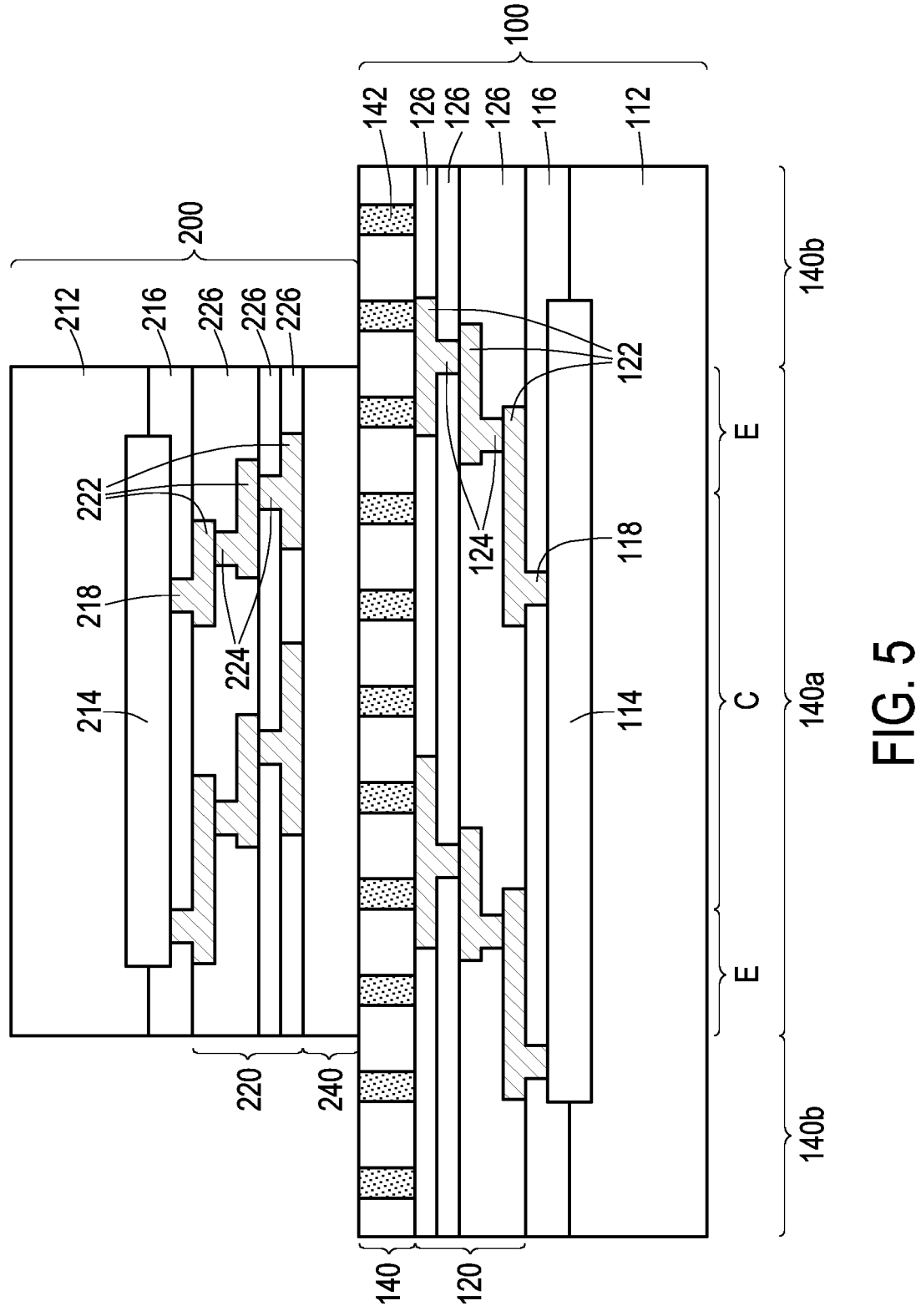
FIG. 5 is a schematic cross-sectional view of a semiconductor device according to some embodiments.

In alternative embodiments, since the composition of the dielectric bonding patterns 142 is different from the dielectric bonding layer 140, the dielectric bonding patterns 142 may serve as alignment marks. In such embodiments, as shown in FIG. 5, the alignment marks 130 of FIG. 1D may be omitted.

Figure 6:
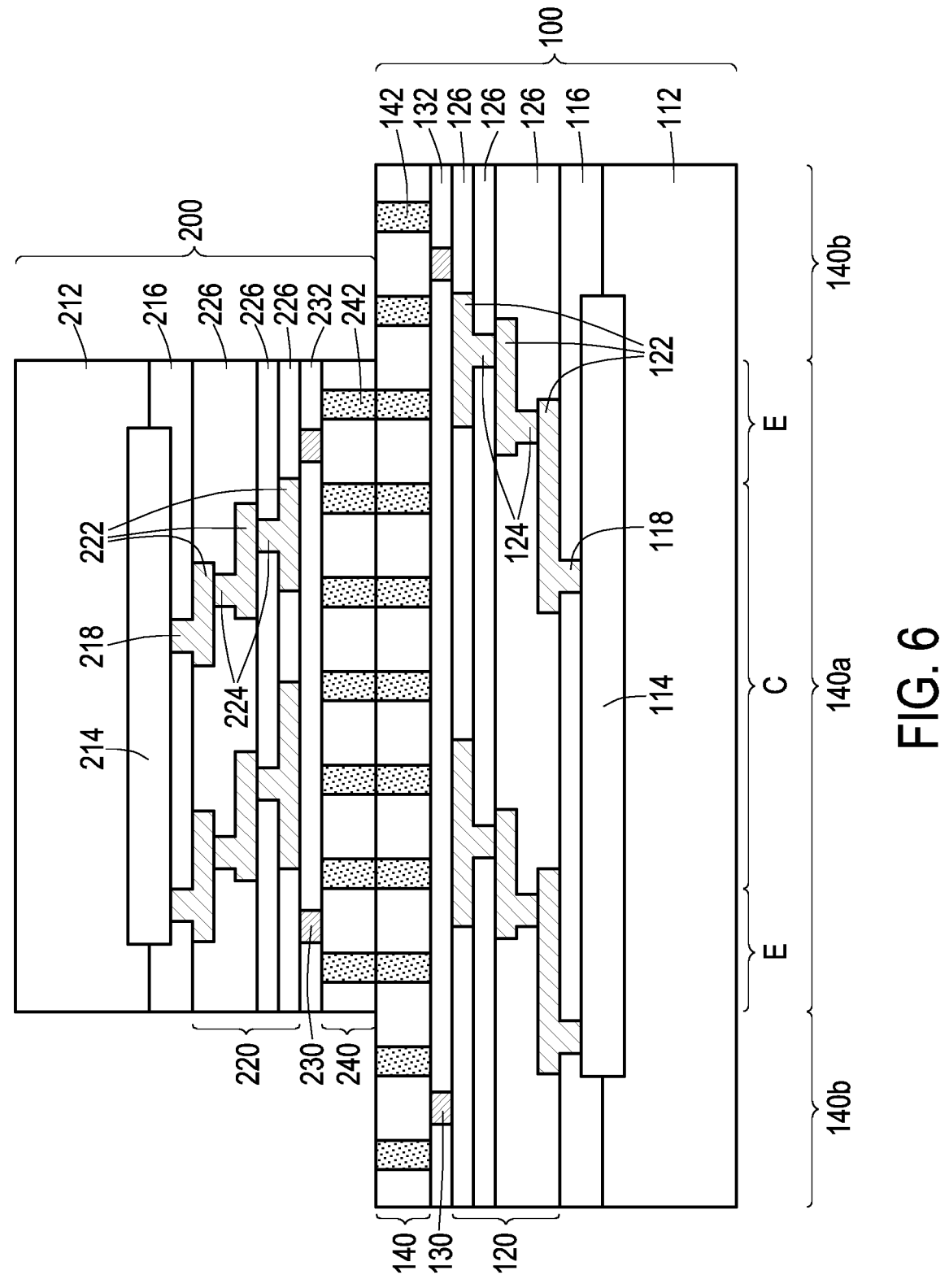
FIG. 6 is a schematic cross-sectional view of a semiconductor device according to some embodiments.

In alternative embodiments, as shown in FIG. 6, the dielectric bonding layer 240 of the package component 200 may include a dielectric bonding layer 240 similar to the dielectric bonding layer 140. In other words, the dielectric bonding layer 240 also has dielectric bonding patterns 242 therein, the materials of the dielectric bonding layer 240 and the dielectric bonding patterns 242 are different from each other, and their formation, structure and properties may be found referring to the discussion of the corresponding dielectric bonding layer 140 and dielectric bonding patterns 142, and are not repeated herein. In such embodiments, the dielectric bonding patterns 242 may be respectively bonded to the dielectric bonding patterns 142. For example, the sidewall of the dielectric bonding pattern 242 is substantially aligned with the sidewall of the dielectric bonding pattern 142. In such embodiments, the dielectric bonding layer 140 is in direct contact with the dielectric bonding layer 240, and the dielectric bonding patterns 142 are in direct contact with the dielectric bonding patterns 242. However, the disclosure is not limited thereto. In some embodiments, each dielectric bonding pattern 242 may be bonded to the dielectric bonding pattern 142 and/or the dielectric bonding layer 140.

Figure 7:
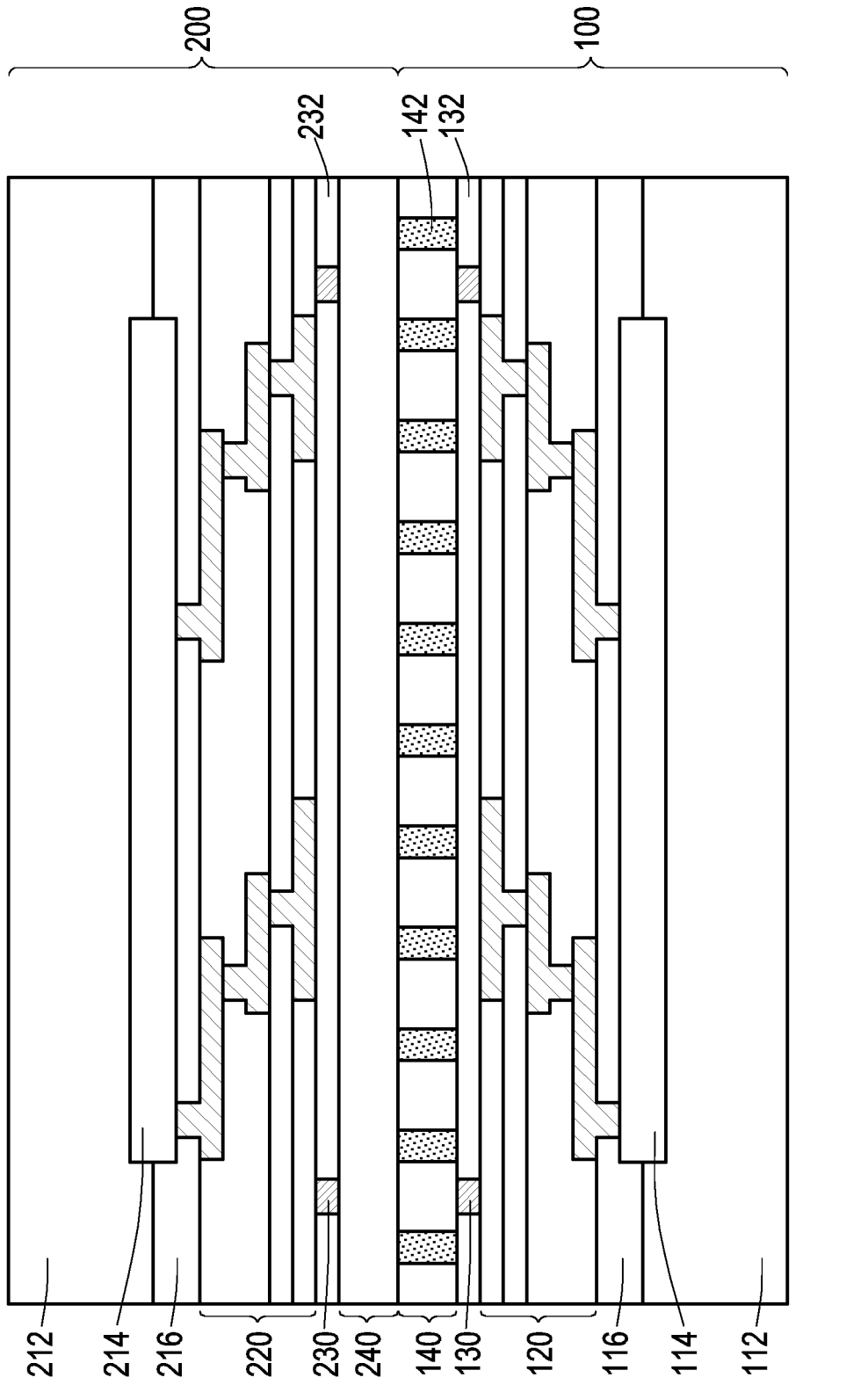
FIG. 7 is a schematic cross-sectional view of a semiconductor device according to some embodiments.
Figure 8:
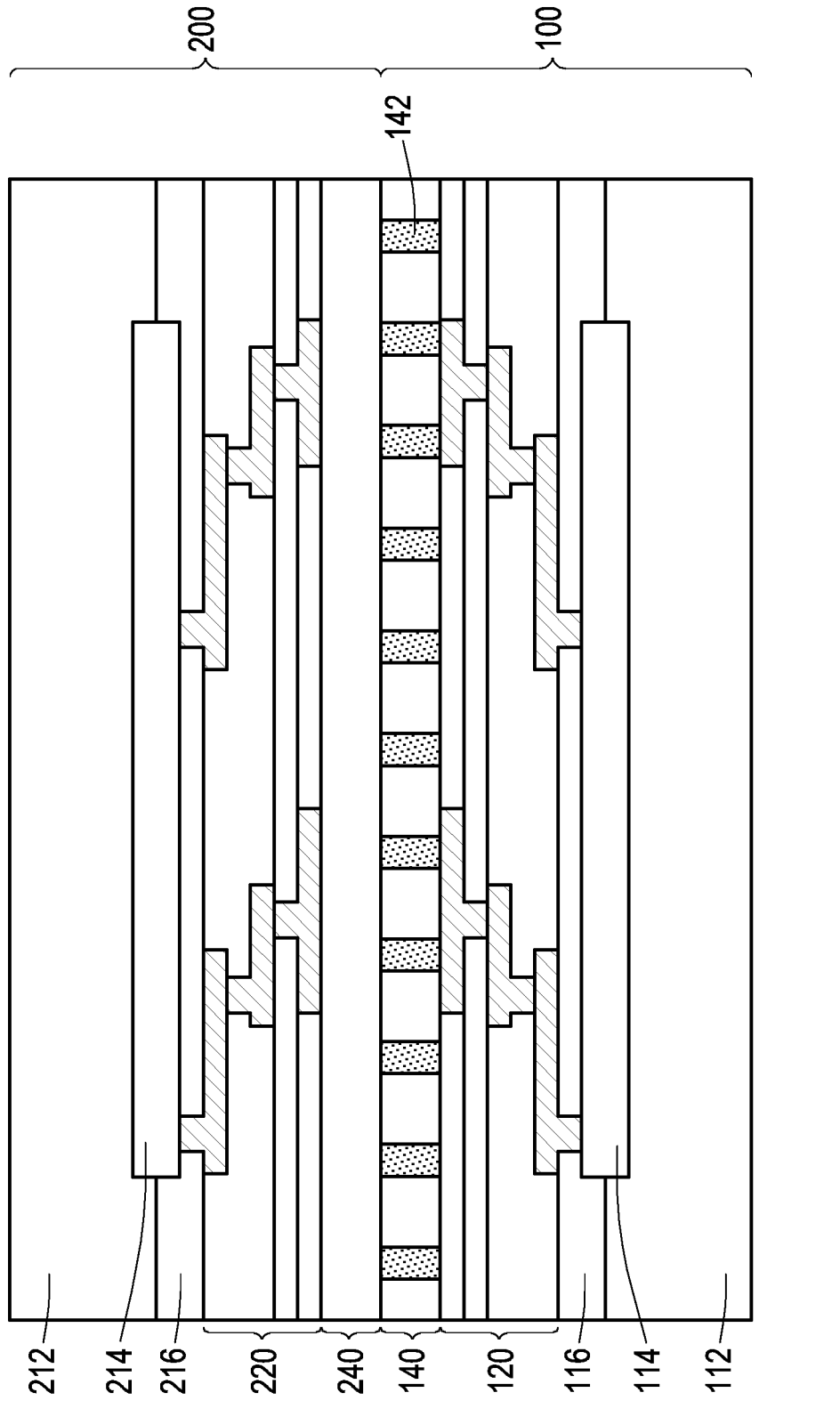
FIG. 8 is a schematic cross-sectional view of a semiconductor device according to some embodiments.
Figure 9:
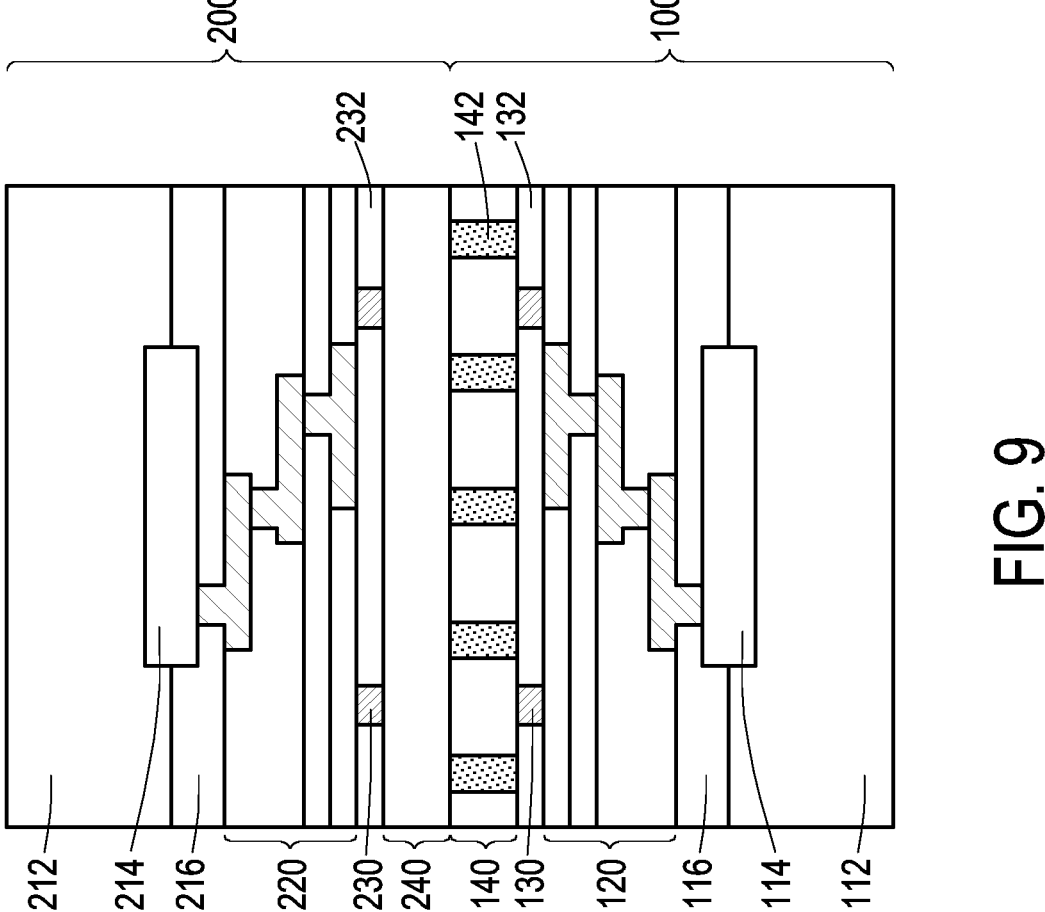
FIG. 9 is a schematic cross-sectional view of a semiconductor device according to some embodiments.
Figure 10:
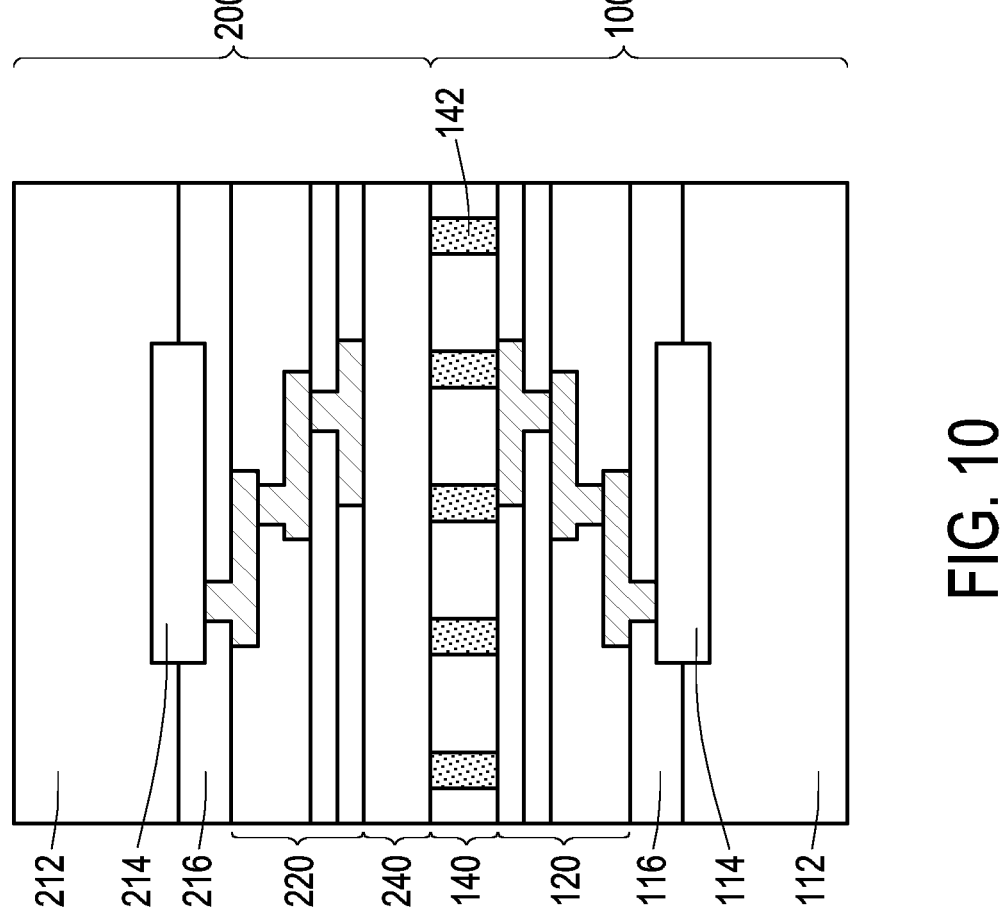
FIG. 10 is a schematic cross-sectional view of a semiconductor device according to some embodiments.

In some embodiments, the package component 100 and the package component 200 are die-to-wafer bonding. However, the embodiments of the disclosure may be applied to wafer-to-wafer bonding and die-to-die bonding. For example, FIG. 7 and FIG. 8 schematically illustrate a wafer-to-wafer fusion bonding scheme. FIG. 9 and FIG. 10 schematically illustrates a chip-to-chip fusion bonding scheme. In FIG. 8 and FIG. 10, the dielectric bonding patterns 142 may serve as alignment marks, and thus the alignment marks 130 of FIG. 7 and FIG. 9 may be omitted. In alternative embodiments, the dielectric bonding layer 240 of the package component 200 in FIGS. 7-10 may have dielectric bonding patterns 242 therein as shown in FIG. 6. The embodiments of the disclosure may also be applied to hybrid bonding. In such embodiments, the bonding further includes metal to metal bonding such as bonding pad to bonding pad bonding.

FIG. 11 illustrates a method of forming a semiconductor device according to some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S100, a first package component having a first dielectric bonding layer thereon is provided. FIG. 1A and FIG. 5-10 illustrate views corresponding to some embodiments of act S100.

At act S102, a plurality of first dielectric bonding patterns are formed in the first dielectric bonding layer. FIG. 1B and FIG. 5-10 illustrate views corresponding to some embodiments of act S102.

At act S104, a second package component having a second dielectric bonding layer thereon is provided. FIG. 1C and FIG. 5-10 illustrate views corresponding to some embodiments of act S104.

At act S106, the first package component and the second package component are bonded through the first dielectric bonding layer and the second dielectric bonding layer. FIG. 1D and FIG. 5-10 illustrate views corresponding to some embodiments of act S106.

In accordance with some embodiments of the disclosure, a semiconductor device includes a first die. The first die includes a first dielectric bonding layer thereon and a plurality of first dielectric bonding patterns in the first dielectric bonding layer. A composition of the first dielectric bonding patterns is different from a composition of the first dielectric bonding layer.

In accordance with some embodiments of the disclosure, a semiconductor device includes a first package component and a second package component. The first package component has a first dielectric bonding layer thereon and a plurality of first dielectric bonding patterns in the first dielectric bonding layer. An interface exists between the first dielectric bonding layer and the first dielectric bonding pattern. The second package component has a second dielectric bonding layer thereon. The first package component and the second package component are bonded through the first dielectric bonding layer and the second dielectric bonding layer and through the first dielectric bonding patterns and the second dielectric bonding layer.

In accordance with some embodiments of the disclosure, a method of forming a semiconductor device is as follows. A first package component having a first dielectric bonding layer thereon is provided. A plurality of first dielectric bonding patterns are formed in the first dielectric bonding layer. A second package component having a second dielectric bonding layer thereon is provided. The first package component and the second package component are bonded through the first dielectric bonding layer and the second dielectric bonding layer.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first die having an interconnect structure and a first dielectric bonding layer covering a top surface of the interconnect structure; and
   a plurality of first dielectric bonding patterns in the first dielectric bonding layer, wherein a composition of the first dielectric bonding patterns is different from a composition of the first dielectric bonding layer, wherein first surfaces of the first dielectric bonding patterns are substantially coplanar with a first surface of the first dielectric bonding layer, and second surfaces opposite to the first surfaces of the first dielectric bonding patterns are substantially coplanar with a second surface opposite to the first surface of the first dielectric bonding layer.

2. The semiconductor device of claim 1, wherein the first dielectric bonding layer has a bonding region and a non-bonding region, and a density of the first dielectric bonding patterns in the bonding region is not smaller than a density of the first dielectric bonding patterns in the non-bonding region.

3. The semiconductor device of claim 1, wherein the first dielectric bonding layer and the first dielectric bonding patterns respectively include $SiO_xN_yC_z$, x=0 to 2, y=0 to 1.33,z=0 to 1, and x, y and z are not all equal to zero.

4. The semiconductor device of claim 3, wherein the first dielectric bonding layer and the first dielectric bonding patterns respectively include $SiO_2$, SiON, SiOC, SiN, SiCN, SiC, SiON or a combination thereof.

5. The semiconductor device of claim 1, wherein the first dielectric bonding layer has a plurality of non-bonding regions and a bonding region disposed between the non-bonding regions, and a density of the first dielectric bonding patterns in the bonding region is not smaller than a density of the first dielectric bonding patterns in the non-bonding regions.

6. The semiconductor device of claim 2, wherein the bonding region has a first surface facing the interconnect structure and a second surface opposite to the first surface of the bonding region, the non-bonding region has a first surface facing the interconnect structure and a second surface opposite to the first surface of the non-bonding region, and the first surface of the bonding region is substantially coplanar to with the first surface of the non-bonding region.

7. The semiconductor device of claim 6, wherein the second surface of the bonding region is substantially coplanar with the second surface of the non-bonding region.

8. The semiconductor device of claim 2, wherein the interconnect structure and the first dielectric bonding layer are stacked along a first direction, and the bonding region and the non-bonding region are not overlapped along the first direction.

9. A semiconductor device, comprising:
a first package component having an interconnect structure, a first dielectric bonding layer covering a top surface of the interconnect structure and a plurality of first dielectric bonding patterns in the first dielectric bonding layer, wherein an interface exists between the first dielectric bonding layer and the first dielectric bonding pattern; and
a second package component having a second dielectric bonding layer thereon and a plurality of second dielectric bonding patterns in the second dielectric bonding layer, wherein the first package component and the second package component are bonded through the first dielectric bonding layer and the second dielectric bonding layer and through the first dielectric bonding patterns and the second dielectric bonding layer, wherein each of the second dielectric bonding patterns is bonded to at least one of the first dielectric bonding layer and the first dielectric bonding pattern.

10. The semiconductor device of claim 9, wherein first surfaces of the first dielectric bonding patterns are substantially coplanar with a first surface of the first dielectric bonding layer, and first surfaces of the second dielectric bonding patterns are substantially coplanar with a first surface of the second dielectric bonding layer.

11. The semiconductor device of claim 9, wherein the first dielectric bonding layer and the first dielectric bonding patterns are in direct contact with the second dielectric bonding layer.

12. The semiconductor device of claim 9, wherein a material of the first dielectric bonding patterns is different from a material of the first dielectric bonding layer.

13. The semiconductor device of claim 9, wherein the first dielectric bonding layer and the first dielectric bonding patterns respectively include $SiO_xN_yC_z$, x=0 to 2, y=0 to 1.33, z=0 to 1, and x, y and z are not all equal to zero.

14. The semiconductor device of claim 9, wherein the first dielectric bonding layer and the first dielectric bonding patterns respectively include $SiO_2$, SiON, SiOC, SIN, SiCN, SiC, SiON or a combination thereof.

15. The semiconductor device of claim 9, wherein the first dielectric bonding layer has a first surface facing the second package, one of the first dielectric bonding patterns has a first surface facing the second package, and the first surface of the first dielectric bonding layer is substantially coplanar with the first surface of the one of the first dielectric bonding patterns.

16. A method of forming a semiconductor device, comprising:
providing a first package component having a first dielectric bonding layer thereon;
forming a plurality of first dielectric bonding patterns in the first dielectric bonding layer, comprising:
forming a plurality of openings in the first dielectric bonding layer;
forming the first dielectric bonding patterns respectively in the openings; and
performing a chemical mechanical polishing process, so that surfaces of the first dielectric bonding patterns are substantially coplanar with a surface of the first dielectric bonding layer,
wherein opposite sidewalls of one of the first dielectric bonding patterns are physically connected to the first dielectric bonding layer;
providing a second package component having a second dielectric bonding layer thereon; and
bonding the first package component and the second package component through the first dielectric bonding layer and the second dielectric bonding layer.

17. The method of claim 16, further comprising forming a plurality of second dielectric bonding patterns in the second dielectric bonding layer, wherein the first package component and the second package component are further bonded through bonding the first dielectric bonding patterns and the second dielectric bonding patterns.

18. The method of claim 16, wherein the first package component has a bonding region bonded to the second package component and a non-bonding region aside the bonding region, and a density of the first dielectric bonding patterns in the bonding region is not smaller than a density of the first dielectric bonding patterns in the non-bonding region.

19. The semiconductor device of claim 17, wherein one of the second dielectric bonding patterns is bonded to at least one of the first dielectric bonding layer and the first dielectric bonding pattern.

20. The semiconductor device of claim 17, wherein surfaces of the second dielectric bonding patterns are substantially coplanar with a surface of the second dielectric bonding layer.

* * * * *